United States Patent [19]

Hamada et al.

[11] Patent Number: 5,324,985
[45] Date of Patent: Jun. 28, 1994

[54] PACKAGED SEMICONDUCTOR DEVICE

[75] Inventors: Tomomi Hamada, Sanda; Seiji Takemura, Itami; Masataka Kawai; Takaaki Okidono, both of Kawanishi, all of Japan

[73] Assignee: Mitsubishi Denki Kabushiki Kaisha, Tokyo, Japan

[21] Appl. No.: 877,194

[22] Filed: May 1, 1992

[30] Foreign Application Priority Data

May 13, 1991 [JP] Japan .................. 3-106985

[51] Int. Cl.⁵ .......................... H01L 23/02
[52] U.S. Cl. .................... 257/697; 257/787
[58] Field of Search ............ 257/697, 787, 692

[56] References Cited

U.S. PATENT DOCUMENTS 4,677,526 6/1987 Muehling ............... 257/787
4,733,293 3/1988 Gabuzda ............... 257/697

FOREIGN PATENT DOCUMENTS 161843 9/1984 Japan .

*Primary Examiner*—Rolf Hille
*Assistant Examiner*—Roy Potter
*Attorney, Agent, or Firm*—Leydig Voit & Mayer

[57] ABSTRACT

A semiconductor element such as an encapsulated or non-encapsulated semiconductor chip having a multitude of terminals is mounted on one surface of a quadrate substrate. A multitude of connector pins extend from the other surface of the substrate. A plurality of connector lands are formed on a surface of the substrate and electrically connected to the corresponding terminals of the semiconductor element. The connector lands are electrically connected to the connector pins through wiring. The connector pins have a pitch that is larger near the connector lands than at locations farther away from the lands. The pitch between adjacent connector pins is made larger as necessary or desired so as to allow the passage of an increased number of connecting wires between the adjacent connector pins, thus ensuring high density wiring with improved efficiency.

8 Claims, 5 Drawing Sheets

PACKAGED SEMICONDUCTOR DEVICE

BACKGROUND OF THE INVENTION

The present invention relates to a semiconductor package, and, more particularly, but not exclusively, to a pin-grid-array device (hereinafter abbreviated as a PGA package) including a substrate provided at one surface with a plurality of connector pins.

A typical conventional PGA semiconductor package is shown in FIGS. 8 and 9. The illustrated PGA package includes a semiconductor element 102 in the form of a quad-flat package (hereinafter simply referred to as a QFP) or a packaged or encapsulated semiconductor chip of a quadrate or rectangular configuration mounted on a surface of a quadrate or rectangular-shaped substrate 101, the QFP 102 having a multitude of terminals 103 outwardly extending from the outer peripheral side surfaces thereof. The terminals 103 are connected such as by soldering to corresponding mounting or connector lands 104 which are formed on the substrate 101 in an aligned, parallel relation to the four side edges thereof at locations separated a predetermined distance therefrom. The connector lands 104 are electrically connected through fine connecting wires 105 such as gold wires to corresponding external terminals 106 in the form of connector pins which are disposed around the QFP 102 and which extend from and perpendicular to the other surface of the substrate 101. The respective connector pins 106 have their basal ends inserted into and fixedly secured such as by soldering to corresponding through-holes (not shown) in the substrate 101 that are arranged in a grid-like pattern.

With the above-described conventional PGA package, however, the multitude of connector pins 106 are disposed at one and the same pitch or interval (for example, 2.54 mm, 1.78 mm or 1.27 mm). As a result, it is required that connecting wires connecting the connector pins 106 and the respective connector lands 104 be carefully arranged so as not to be in contact with adjacent connector pins 106. Accordingly, the number of connector pins 106 is limited and the distance or pitch between adjacent connector pins 106 is relatively large, so the number of connecting wires 105 passing between adjacent connector pins 106 particularly near the corners of the QFP 102 is limited, thus causing no problem or difficulty in wiring. However, as the number of the connector pins 106 increases, the following problems arise.

In the course of recent developments in semiconductor technology, an increased number of the connector pins 106 as well as the resultant reduced distance or pitch between adjacent pins 106 inevitably leads to an increase in wiring density of the connecting wires 105, thus causing increased difficulty in wiring. In particular, the number of the connecting wires to be disposed between adjacent connector pins 106 is increased at locations near the mounting or connector lands 104, so difficulty in wiring first arises at locations near the connector lands 104.

SUMMARY OF THE INVENTION

Accordingly, the present invention is aimed at solving the above-described problems encountered with the conventional semiconductor device packages.

An object of the invention is to provide a novel and improved semiconductor package in which even if the number of terminals of a semiconductor element, such as a semiconductor chip, greatly increases, wiring connecting respective connector lands connected to the terminals of the semiconductor element and connector pins can be completed in an easy and efficient manner.

In order to achieve the above objects, according to one aspect of the present invention, there is provided a semiconductor package comprising: a substrate having opposed first and second surfaces; a semiconductor element mounted on the first surface of the substrate and having a multitude of terminals; a multitude connector pins provided on and extending from the second surface of the substrate; and a plurality of connector lands formed on the first surface of the substrate and electrically connected to the corresponding terminals of the semiconductor element, the connector lands being electrically connected to the connector pins through wiring. The connector pins have a pitch between adjacent pins that is greater at locations near the connector lands than at locations far away from the connector lands.

Preferably, the semiconductor element is of a quadrate configuration having four sides, and the connector lands are disposed in an aligned array around the quadrate semiconductor element along each of the four sides thereof. The connector pins are disposed in a plurality of rows along each array of connector lands.

In one form, the semiconductor element comprises an encapsulated semiconductor element.

In another form, the semiconductor element comprises an non-encapsulated semiconductor element, and the substrate first surface includes a chip-mounting recess having an outer periphery. The connector lands are provided on the first surface of the substrate around the outer periphery of the chip-mounting recess. The non-encapsulated semiconductor element is received in the chip-mounting recess and covered with a lid member attached to the first surface of the substrate.

The above and other objects, features and advantages of the invention will be more readily apparent from the following detailed description of a few preferred embodiments of the invention taken in conjunction with the accompanying drawings.

DESCRIPTION OF THE PREFERRED EMBODIMENTS

Preferred embodiments of the present invention will now be described in detail with reference to the accompanying drawings.

Figure 1:
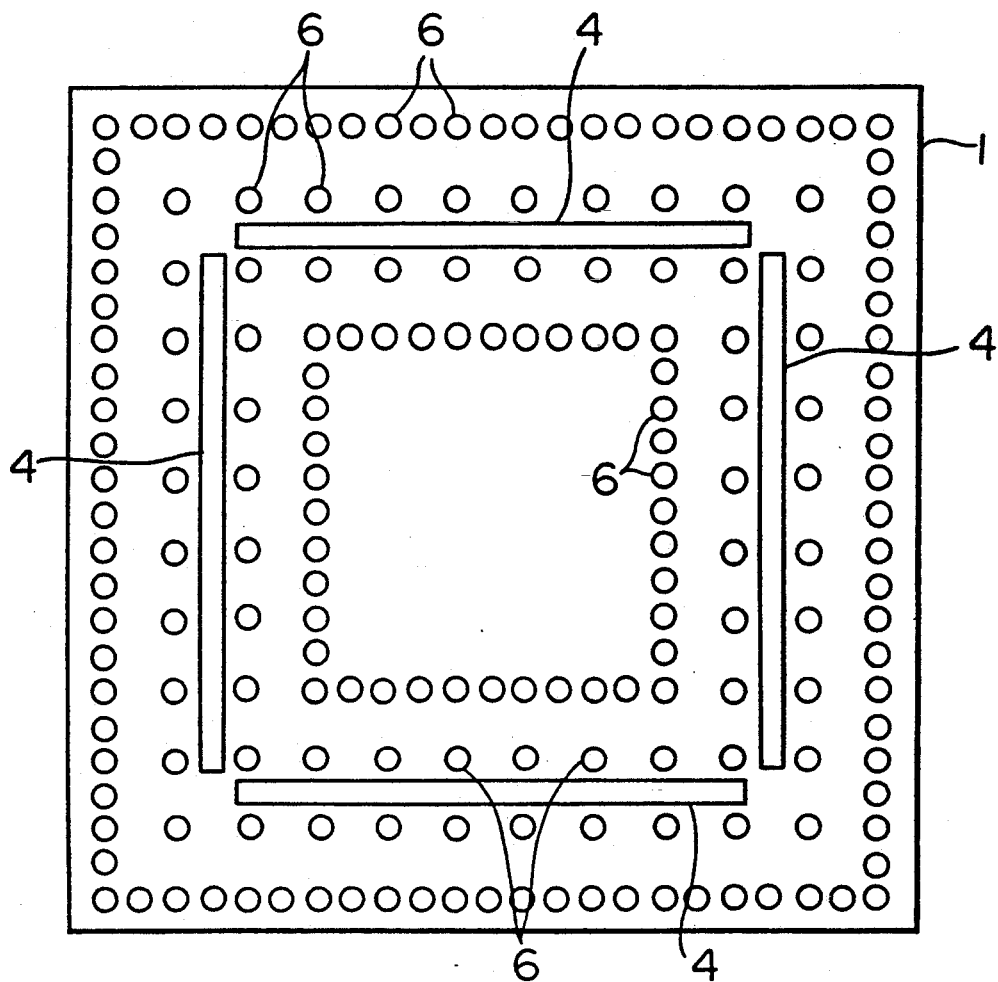
FIG. 1 is a plan view of a PGA semiconductor package (QFP) with a semiconductor element in the form of an encapsulated packaged chip removed in accordance with a first embodiment of the invention.
Figure 2:
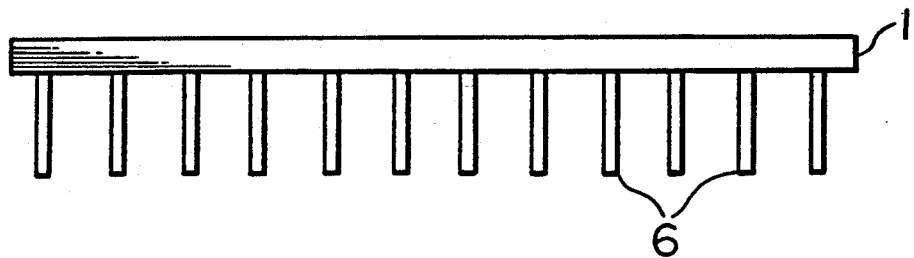
FIG. 2 is a side elevation of the semiconductor package of FIG. 1.
Figure 3:
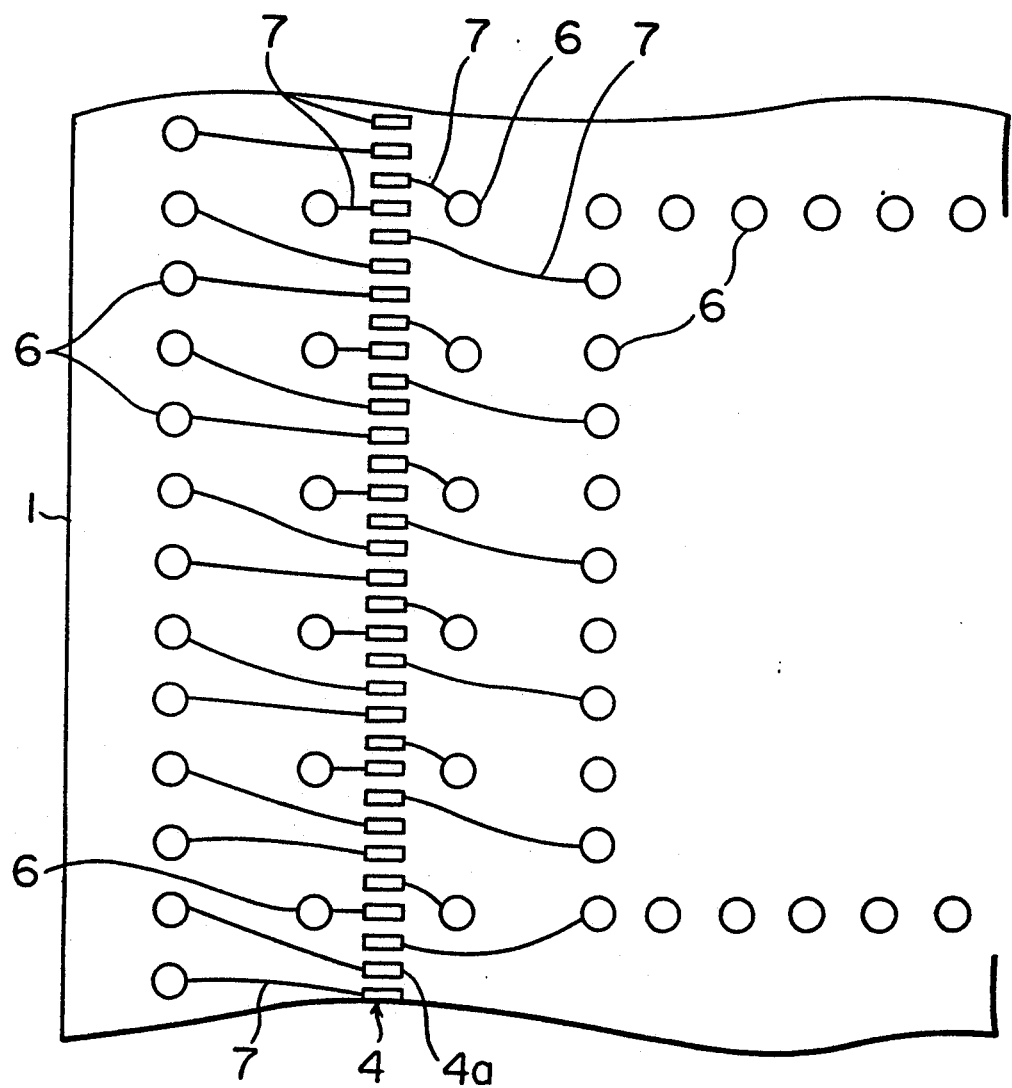
FIG. 3 is a partial plan view, on an enlarged scale, of a part of the semiconductor package of FIG. 1.
Figure 4:
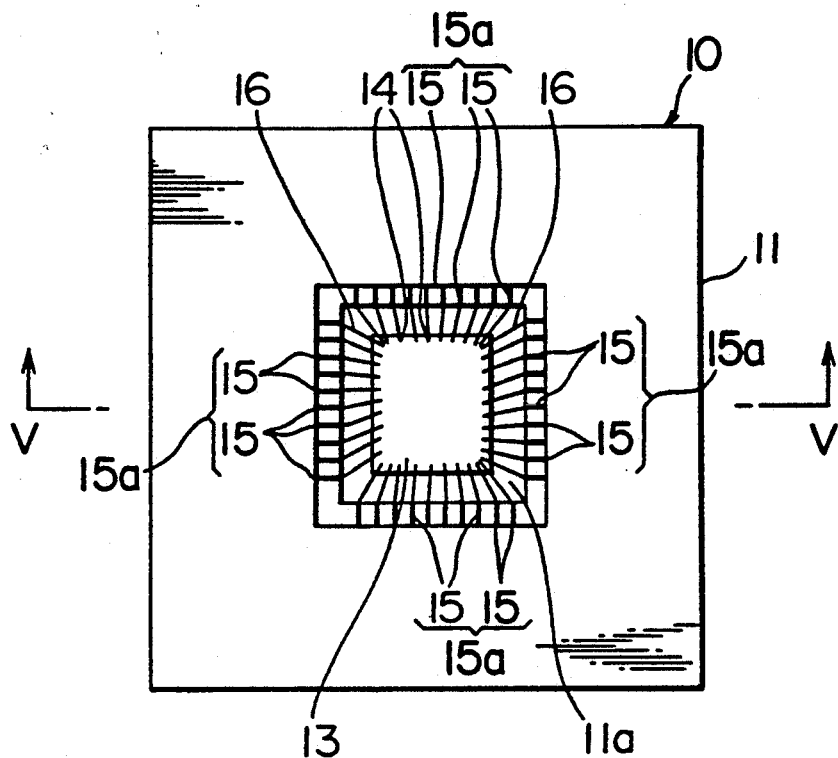
FIG. 4 is a plan view of a semiconductor package having a semiconductor element in the form of a bare chip mounted thereon with a lid member removed in accordance with a second embodiment of the invention.
Figure 8:
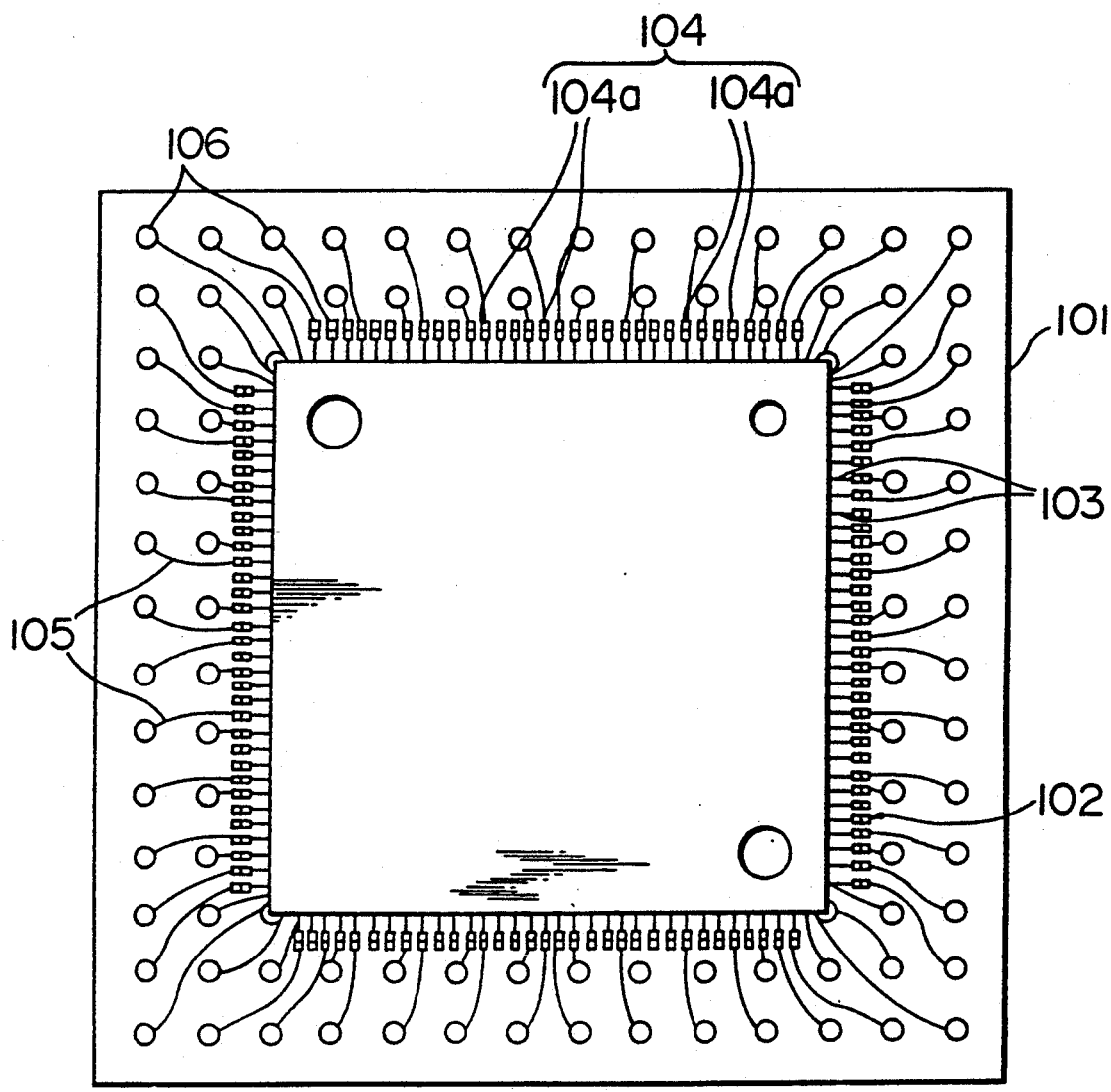
FIG. 8 is a plan view of a conventional quad-flat semiconductor package.
Figure 9:
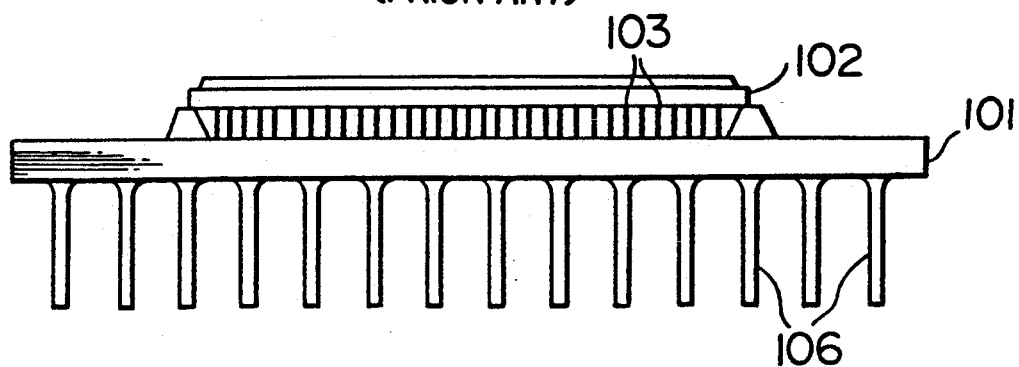
FIG. 9 is a side elevation of the conventional semiconductor package of FIG. 8.

Referring to the drawings and first to FIGS. 1 through 3, there is shown a semiconductor package in the form of a PGA package constructed in accordance with the principles of the invention. In these figures, the basic construction of the semiconductor package is illustrated with a semiconductor element removed for the sake of simplicity and clearness in explanation. The removed semiconductor element (not shown) may be an encapsulated semiconductor element such as an encapsulated semiconductor integrated circuit, an encapsulated semiconductor chip and the like which may be the same as the QFP 102 of the aforementioned conventional semiconductor package illustrated in FIGS. 8 and 9, and mounted on one surface of a quadrate flat substrate 1. In this embodiment, four connector land arrays 4 are disposed on the first surface of the quadrate flat substrate 1 along and parallel to four sides of a quadrate semiconductor element mounting portion on which the unillustrated semiconductor element is located and mounted. As clearly shown on an enlarged scale in FIG. 3, each of the connector land arrays 4 includes a multitude of discrete connector lands 4a aligned in a row, similar to connector lands 104a in FIG. 8, to which corresponding terminals of the unillustrated semiconductor element are connected such as by soldering. Inside of each aligned connector land array 4, there are disposed a plurality of (e.g., two in the illustrated embodiment) rows of external terminals or connector pins 6 along and parallel to the corresponding connector land array 4. Likewise, outside of each aligned connector land array 4, a plurality of (e.g., two in the illustrated embodiment) rows of connector pins 6 are also disposed along and in parallel with the corresponding connector land array 4. As illustrated in FIG. 2, the connector pins 6 have their basal ends implanted into the substrate 1 and fixedly secured thereto such as by soldering, and their tip ends extending perpendicular to the backside of the substrate 1. As can be clearly seen from FIG. 3, the respective connector lands 4a of the connector land arrays 4 are electrically connected to corresponding connector pins 6 through wiring 7 in the form of connecting wires on the surface of the substrate 1. As is evident from FIGS. 1 and 3, among the connector pins 6, those which are aligned in a row have substantially a constant interval or pitch between mutually adjacent pins, but those connector pins 6 which are disposed in different rows have different intervals or pitches. More specifically, a row of connector pins 6 near a corresponding connector land array 4 have an interval or pitch greater than that of another row of connector pins 6 which are disposed at locations far away from the corresponding connector land array 4. That is, the nearer to the connector land arrays 4, the greater becomes the interval or pitch between mutually adjacent connector pins 6. In the illustrated embodiment of FIGS. 1 through 3, a first outer row of connector pins 6, which are disposed near and outside a corresponding connector land array 4, have a pitch substantially two times greater than that of a second outer row of external connector pins 6, which are far away and outside the corresponding connector land array 4. Likewise, a first inner row of connector pins 6, which are disposed near and inside a corresponding connector land array 4, have a pitch substantially two times greater than that of a second inner row of connector pins 6, which are disposed far away from and inside the corresponding connector land array 4. In general, the pitch of the connector pins 6 aligned in a row is determined on the basis of the number and width of wiring lines or connecting wires 7 to be arranged between adjacent connector pins 6.

As described above, according to the above embodiment, the interval or pitch of the connector pins 6 on the substrate 1 becomes wider as the perpendicular distance to a corresponding connector land array 4 decreases. As a result, the number of wiring lines or connecting wires 7 to be arranged between mutually adjacent connector pins 6 aligned in a row increases in accordance with the decreasing distance to the connector land arrays 4. This allows a semiconductor element having a greater number of terminals than a conventional element to be employed or mounted on the substrate 1. In addition, the substrate 1 may be either a multi-layered substrate or a single-layered substrate.

FIGS. 4 through 7 show another embodiment of the invention. In this embodiment, a semiconductor element in the form of a bare or non-encapsulated semiconductor chip is mounted on a substrate in place of a QFP as employed in the first embodiment of FIGS. 1 through 3. Specifically, a pin-grid-array package 10 (hereinafter referred to as a PGA package) in the form of an insulator casing comprises a substrate 11 in the form of a laminated or multi-layered board having a chip-mounting recess 11a formed on one surface thereof, and a lid member 12 attached to the substrate 11 to cover the chip-mounting recess 11a. A quadrate or rectangular-shaped semiconductor element 13 in the form of a bare or non-encapsulated semiconductor chip such as an IC chip, which is provided on and around its outer periphery with a multitude of terminals 14 in the form of electrodes, is received in the chip-mounting recess 11a. The terminal electrodes 14 are electrically connected via fine connecting wires 16 to a multitude of corresponding connector lands or internal terminals 15 which are located on the substrate 11 around the outer periphery of the chip-mounting recess 11a. The lid member 12 is then fitted onto and firmly attached to the surface of the substrate 11 to fully cover and close the recess 11a.

Figure 5:
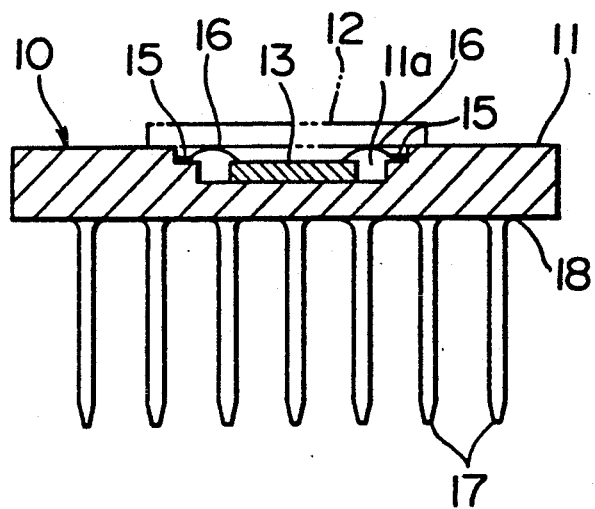
FIG. 5 is a cross section taken along line V—V in FIG. 4.
Figure 6:
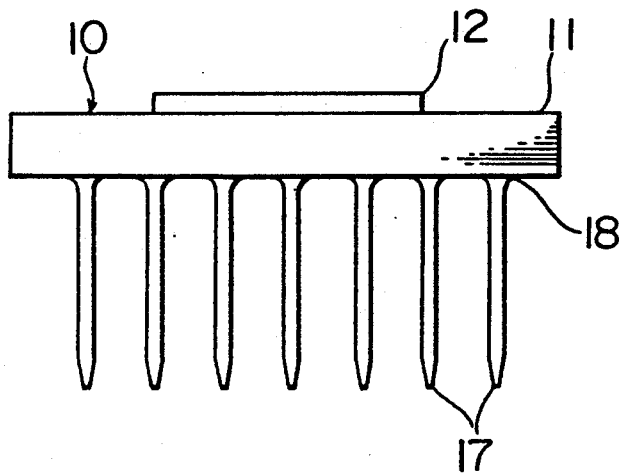
FIG. 6 is a side elevation of the semiconductor package of FIG. 4 but with the lid member attached.
Figure 7:
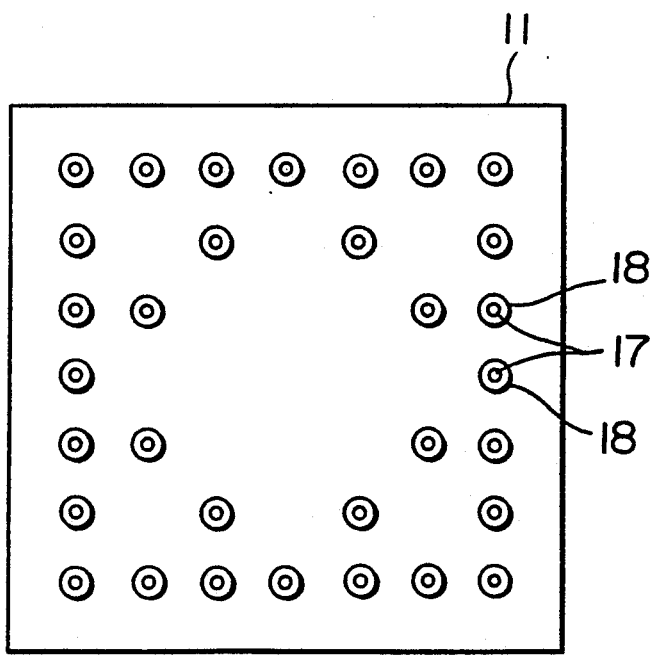
FIG. 7 is a bottom view of the semiconductor package of FIG. 4.

Describing the construction of this embodiment in more detail, the multi-layered substrate 11 has the generally rectangular-shaped recess 11a on one surface, as illustrated in FIG. 5, and a multitude of external terminals or connector pins 17 for electrical connection with an external device, the connector pins 17 extending perpendicular to the backside or the other surface of the substrate 11. These connector pins 17 are firmly secured at their basal ends to the multi-layered substrate 11 at predetermined positions by means of an adhesive 18. On one surface of the substrate 11 around the outer periphery of the rectangular-shaped chip-mounting recess 11a, there are provided four arrays 15a of discrete internal terminals (15) which are aligned in a row along each of four sides of the recess 11a, the internal terminals 15 being electrically connected to corresponding connector pins 17 through a wiring circuit (not shown) which is formed in the interior of the multi-layered substrate 11, i.e., on some of the substrate layers. As clearly seen in FIG. 7, the connector pins 17 include a plurality of rows of connector pins disposed along and substantially parallel to each array 15a of aligned internal terminals 15 around the chip-mounting recess 11a. In the illustrated example, they include an inner row of connector pins disposed near each internal terminal array and an outer row of connector pins disposed far away therefrom. The connector pins 17 in an inner row have a pitch or interval (i.e., a distance between adjacent pins) greater (e.g., about two times greater) than that of the connector pins 17 in an outer row. Thus, the pitch between the adjacent connector pins 17 becomes wider or greater at locations near the internal terminals 15 than at locations far away therefrom, so that wiring connections between the connector pins 17 and the internal terminals or connector lands 15 can be easily made in an efficient manner even in the vicinity of the internal terminals 15.

Although in the above-described second embodiment of FIGS. 4 through 7, the substrate 11 is multi-layered, it may be constructed of a single-layered substrate such as a ceramic substrate.

As can be seen from the foregoing, according to the present invention, the connector pins of the substrate, which are connected via wiring or a connecting circuit to corresponding connector lands of connector land arrays which are connected to terminals of a semiconductor element, are arranged such that the pitch or interval between adjacent connector pins is greater at locations near the connector lands than at locations far away therefrom. As a result, even if the number of terminals of the semiconductor element, such as a semiconductor chip, whether encapsulated or not, mounted on the substrate increases, the pitch between adjacent connector pins can be properly widened or made greater as necessary to allow the passage of an increased number of connecting wires between adjacent connector pins, thus ensuring high density wiring with improved efficiency.

What is claimed is:

1. A packaged semiconductor device comprising:
   a substrate having opposed first and second surfaces;
   a semiconductor element mounted on the first surface of said substrate and having a multitude of terminals;
   a multitude of connector pins extending from the second surface of said substrate and exposed at the first surface of said substrate; and
   a plurality of connector lands disposed on the first surface of said substrate and electrically connected to corresponding terminals of said semiconductor element, said connector lands being spaced from and electrically connected to corresponding connector pins by wiring wherein said connector pins are arranged in said substrate with a pitch between adjacent connector pins that is larger for connector pins nearer said connector lands than for connector pins farther from said connector lands.

2. The semiconductor package according to claim 1 wherein said semiconductor element has a quadrate configuration including four sides, said connector lands are disposed in rows along each of the four sides of said quadrate semiconductor element, and said connector pins are disposed in a plurality of rows disposed along corresponding rows of said connector lands.

3. The semiconductor package according to claim 2 wherein said connector pins are disposed in at least a first row and a second row located on the opposite side of a row of said connector lands from said semiconductor element, the first and second rows of connector pins being disposed at locations respectively nearer and farther away from the corresponding row of connector lands such that the pitch of connector pins in the first row of connector pins is larger than the pitch of connector pins in the second row of connector pins.

4. The semiconductor package according to claim 2 wherein said connector pins are disposed in at least a first row and a second row located on the same side of a row of said connector lands as said semiconductor element, the first and second rows of connector pins being disposed at locations respectively nearer and farther away from the corresponding row of connector lands land row such that the pitch of connector pins in the first row of connector pins is larger than the pitch of connector pins in the second row of connector pins.

5. A semiconductor package according to claim 2 wherein said connector pins are disposed in at least first and second rows and third and fourth rows respectively located on opposite sides of a row of said connector lands, the first and second rows of connector pins being disposed at locations respectively nearer and farther away from the corresponding row of connector lands such that the pitch of connector pins in the first row of connector pins is larger than the pitch of connector pins in the second row of connector pins, the third and fourth rows of connector pins being disposed at locations respectively nearer and farther away from the corresponding row of connector lands such that the pitch of connector pins in the third row of connector pins is larger than the pitch of connector pins in the fourth row of connector pins.

6. The semiconductor package according to claim 1 wherein said semiconductor element comprises an encapsulated semiconductor element.

7. The semiconductor package according to claim 1 wherein said semiconductor element comprises an non-encapsulated semiconductor element.

8. The semiconductor package according to claim 7 including a lid wherein said substrate includes at the first surface a chip-mounting recess having an outer periphery, said connector lands being disposed on the first surface of said substrate around an outer periphery of said chip-mounting recess, said non-encapsulated semiconductor element being received in said chip-mounting recess and covered with said lid, said lid being attached to the first surface of said substrate.

* * * * *